United States Patent
Mullady et al.

(10) Patent No.: US 8,900,004 B2
(45) Date of Patent: Dec. 2, 2014

(54) SLIM LINE MECHANISM

(75) Inventors: Robert K. Mullady, Highland, NY (US); Mitchell L. Zapotoski, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 638 days.

(21) Appl. No.: 13/210,043

(22) Filed: Aug. 15, 2011

(65) Prior Publication Data

US 2013/0042708 A1 Feb. 21, 2013

(51) Int. Cl.
*H01R 13/64* (2006.01)
*H05K 7/14* (2006.01)

(52) U.S. Cl.
CPC .................................. *H05K 7/1487* (2013.01)
USPC .......................................... 439/377; 439/342

(58) Field of Classification Search
USPC ........... 439/347, 374, 377; 361/754, 741, 802
See application file for complete search history.

(56) References Cited

U.S. PATENT DOCUMENTS

| | | | |
|---|---|---|---|
| 5,366,385 A | 11/1994 | Treleaven | |
| 5,657,204 A * | 8/1997 | Hunt | 361/752 |
| 5,815,377 A | 9/1998 | Lund et al. | |
| 5,868,585 A | 2/1999 | Barthel et al. | |
| 5,967,824 A * | 10/1999 | Neal et al. | 439/342 |
| 6,071,143 A | 6/2000 | Barthel et al. | |
| 6,772,246 B2 | 8/2004 | Kim et al. | |
| 7,540,757 B2 | 6/2009 | Loparco et al. | |

* cited by examiner

*Primary Examiner* — Khiem Nguyen
(74) *Attorney, Agent, or Firm* — Cantor Colburn LLP; Margaret McNamara

(57) ABSTRACT

A slim line mechanism is provided and includes a first body having a stationary track coupled thereto, a first mechanism, which is supportable between the stationary track and the first body and configured to be driven in a first direction, a second mechanism, which is configured to be driven by the first mechanism in a second direction transverse with respect to the first direction, a system by which the first and second mechanisms are coupled to one another and connectors by which the first body is supportively connectable with the first and second mechanisms such that movements thereof in the first and second directions, respectively, are permitted.

20 Claims, 4 Drawing Sheets

SLIM LINE MECHANISM

BACKGROUND

The present invention relates to a slim line mechanism for actuating blind mate cards.

In various computing applications, it is necessary to install memory or processor cards into docking stations of servers, personal computing devices, etc. Often, the cards include a chassis, an actuating mechanism, a printed circuit board (PCB) and a connector. The chassis supports the various components within an outer wall and is installed within a slot of the docking station, the PCB includes a plurality of electrical components for carrying out various application specific processes, the connector electrically couples the electrical components to a connector of the docking station within the slot and the actuating mechanism places the PCB and the connector in their correct positions once the chassis is installed within the slot.

Since docking station slots are often relatively thin as compared to the thickness of the PCB, the actuating mechanism must also be relatively thin as well to permit the chassis to fit within the slots. This required thickness has previously led to the actuating mechanism being prone to failures, such as separation of the actuating mechanism component parts.

SUMMARY

According to an aspect of the present invention, a slim line mechanism is provided and includes a first body having a stationary track coupled thereto, a first mechanism, which is supportable between the stationary track and the first body and configured to be driven in a first direction, a second mechanism, which is configured to be driven by the first mechanism in a second direction transverse with respect to the first direction, a system by which the first and second mechanisms are coupled to one another and connectors by which the first body is supportively connectable with the first and second mechanisms such that movements thereof in the first and second directions, respectively, are permitted.

According to another aspect of the present invention, a slim line mechanism is provided and includes a first body having a stationary track coupled thereto, a first mechanism formed to define a first guide slot, which is supportable between the stationary track and the first body and configured to be driven in a first direction, a second mechanism formed to define a second guide slot, which is configured to be driven by the first mechanism in a second direction, a system by which the first and second mechanisms are coupled to one another and a plurality of buttons supportively connectable with the first body and engageable with the first and second guide slots to respectively secure the first and second mechanisms to the first body along a third direction, the first, second and third directions being transverse with respect to one another.

According to yet another aspect of the invention, a slim line mechanism is provided and includes a first body having a stationary track coupled thereto, a first mechanism, which is supportable between the stationary track and the first body and configured to be driven in a first direction, a second mechanism, which is configured to be interlocked with the first mechanism and thereby configured to be driven by the first mechanism in a second direction transverse with respect to the first direction and a system by which the first and second mechanisms are coupled to one another.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In accordance with aspects of the invention, a slim line mechanism 10 is provided and configured to fit within a chassis of a memory or processor card to be installed within a docking station of a slot of a computing device. The card may further include a printed circuit board (PCB) and a connector. The chassis supports the slim line mechanism 10 within an outer wall and the PCB includes a plurality of electrical components for carrying out various application specific processes. Once the chassis is installed in the slot, the connector is configured to electrically couple the electrical components of the PCB to a connector of the docking station within the slot and the slim line mechanism is configured to place the PCB and the connector in their correct positions for this electrical coupling to occur.

Figure 1:
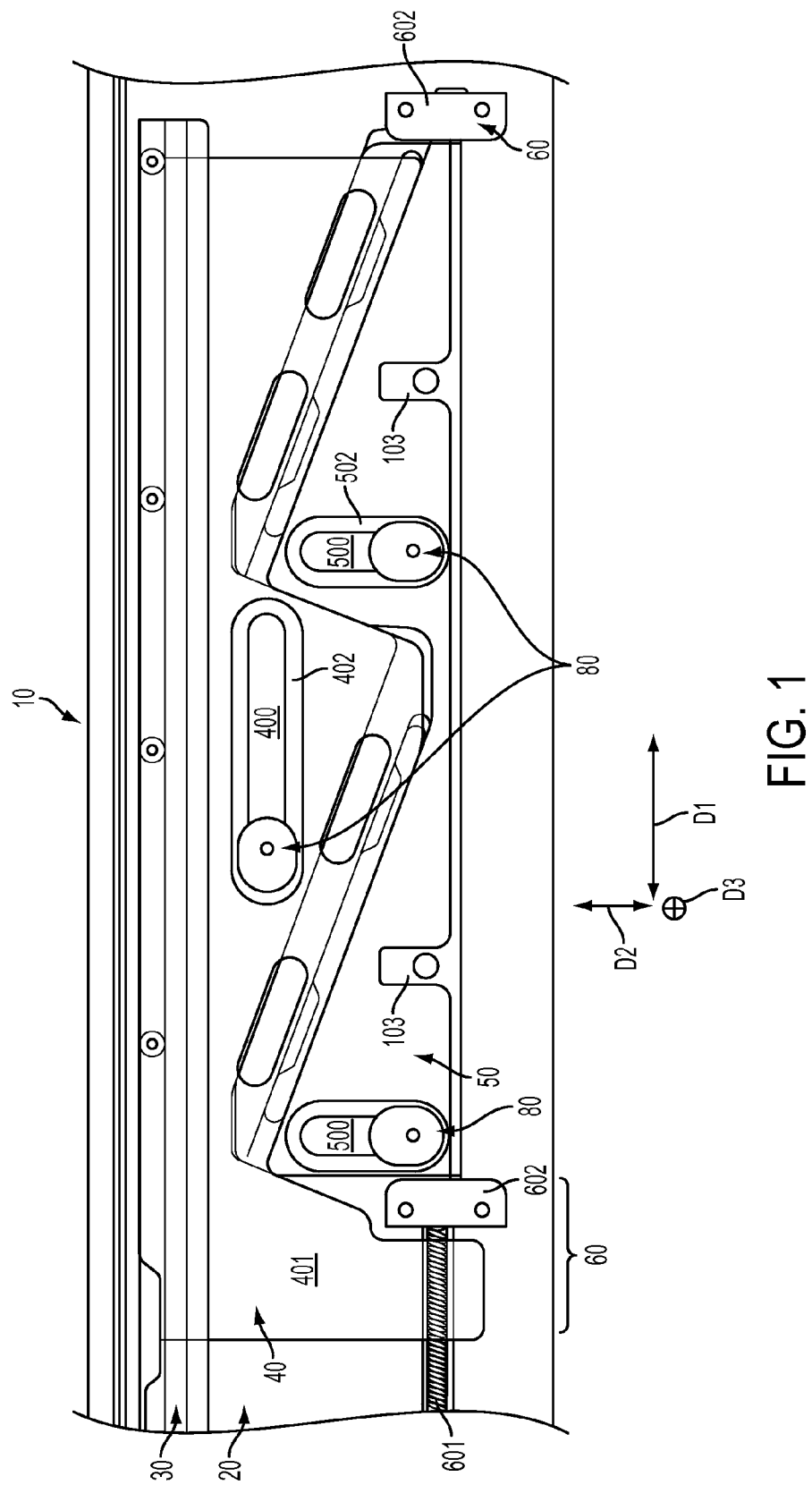
FIG. 1 is a plan view of a slim line mechanism in accordance with embodiments of the invention.
Figure 2:
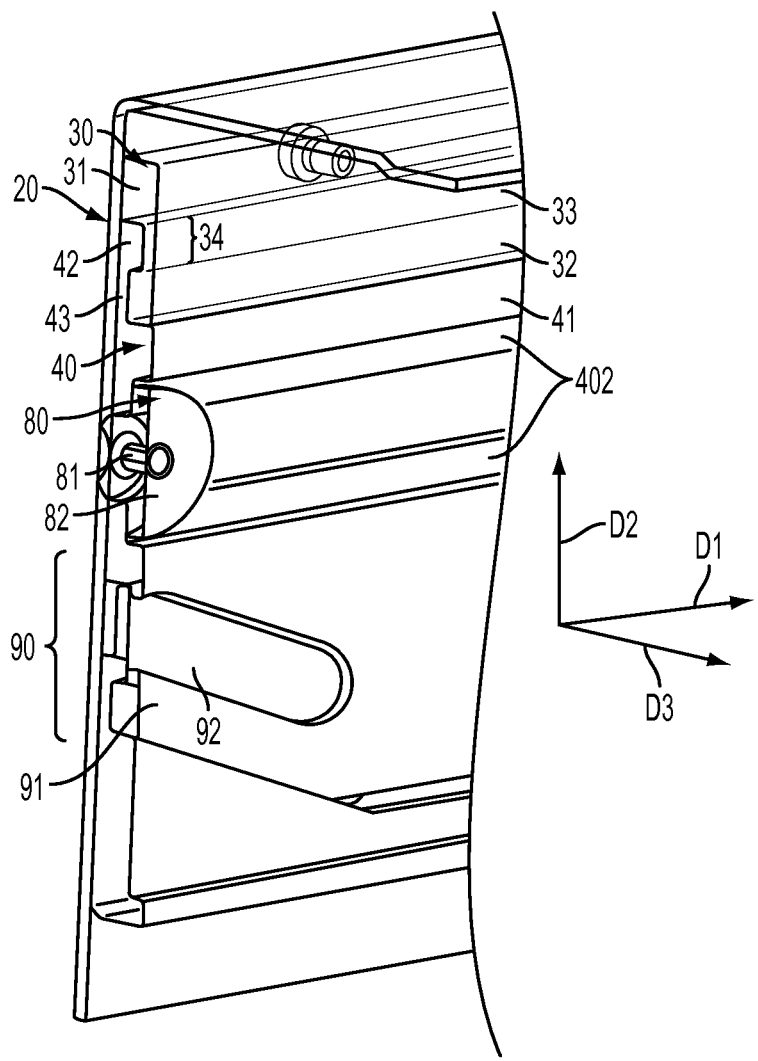
FIG. 2 is a perspective view of components of the slim line mechanism of FIG. 1.
Figure 3:
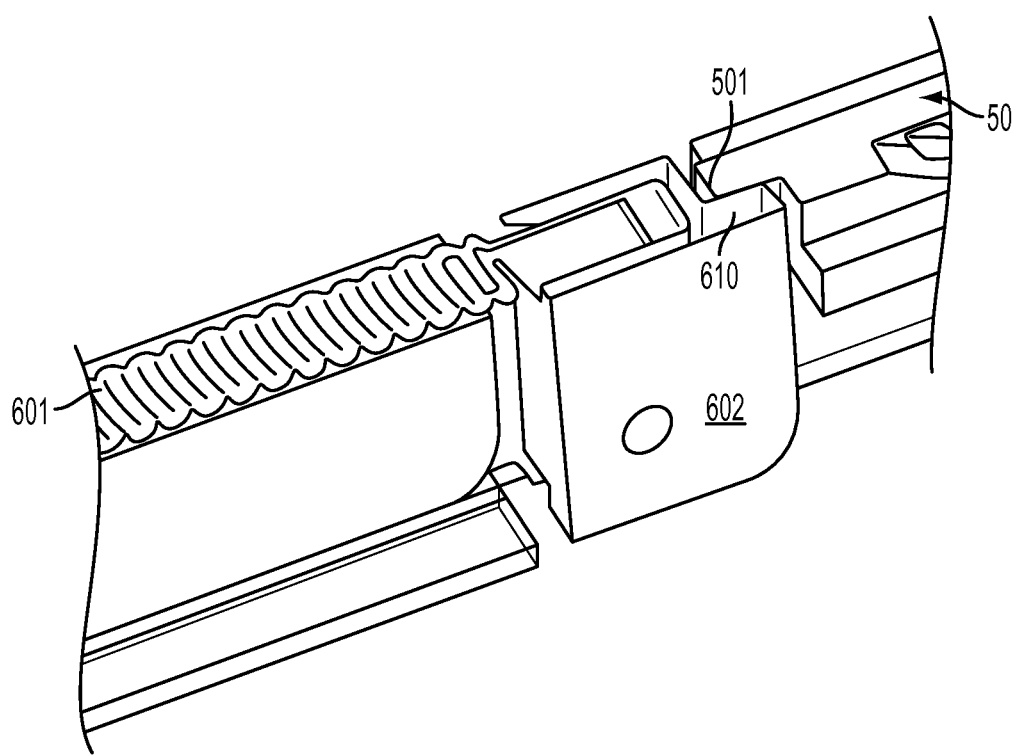
FIG. 3 is a perspective view of further components of the slim line mechanism of FIG. 1.

With reference now to FIGS. 1-3, the slim line mechanism 10 is provided. The slim line mechanism 10 includes a first body 20 (i.e., the chassis), which is generally planar and which has a stationary track 30 coupled thereto by fixtures arranged along a length of the stationary track 30. The stationary track 30 is stationary with respect to the first body 20 and includes a main body 31 and an elongate flange 32. The elongate flange 32 is connected to the main body 31 by a relatively thin arm 33 and is displaced from the first body 20 to define an elongate recess 34.

The slim line mechanism 10 further includes a first linearly or horizontally driven mechanism 40 (hereinafter referred to as a "first mechanism 40"). The first mechanism 40 is supportable between the stationary track 30 and the first body 20 and is configured to be driven by an external force to be described below in a first direction D1 relative to the first body 20. The first mechanism 40 is generally planar and includes a main body 41 and an elongate flange 42. The elongate flange 42 is connected to the main body 41 by a relatively thin arm 43 that is fittable between the elongate flange 32 of the stationary track 30 and the first body 20 such that the elongate flange 42 is fittable within the elongate recess 34. With this construction, as the first mechanism 40 is driven in the first direction D1, the elongate flange 42 moves within the elongate recess 34 in the first direction D1.

The slim line mechanism 10 further includes a second linearly or vertically driven mechanism 50 (hereinafter referred to as a "second mechanism 50"). The second mechanism 50 is configured to be driven by the first mechanism 40 in a second direction D2 relative to the first body 20. The second direction D2 is oriented transversely with respect to the first direction D1. That is, where the first mechanism 40 is driven horizontally in the first direction D1 along the plane of the first body 20, the second mechanism 50 may be driven vertically in the second direction D2 along the plane of the first body 20.

In accordance with embodiments, the second mechanism 50 may be configured to be interlocked with the first mechanism 40 such that movement of the first mechanism 40 in the first direction D1 causes corresponding movement of the second mechanism 50 in the second direction D2. The interlock can be provided by a slip fitting 90, as shown in FIG. 2, whereby the first mechanism 40 includes a recess fitting 91 and the second mechanism 50 includes a tongue 92 that can be slip fit into the recess fitting 91. The recess fitting 91 and the tongue 92 are both oriented at an angle relative to the first and the second direction D1 and D2 and, thus, form a cam configuration that converts the movement of the first mechanism 40 in the first direction D1 into the movement of the second mechanism 50 in the second direction D2.

The first mechanism 40 is further formed to define a first guide slot 400 and the second mechanism 50 is further formed to define at least one guide slot 500. In accordance with embodiments, as will be discussed below, the second mechanism 50 may be formed to define at least two or more second guide slots 500.

The slim line mechanism 10 still further includes a system 60 by which the first and second mechanisms 40 and 50 are coupled to one another and a plurality of retainer buttons 80, which are each supportively connectable with the first body 20 and engageable with the first and second guide slots 400 and 500 to respectively secure the first and second mechanisms 40 and 50 to the first body 20 along a third direction D3. As shown, the first direction D1, the second direction D2 and the third direction D3 are oriented transversely with respect to one another. That is, where the first mechanism 40 is driven horizontally in the first direction D1 along the plane of the first body 20 and the second mechanism 50 is driven vertically in the second direction D2 along the plane of the first body 20, the third direction D3 may be defined as the normal direction relative to the plane of the first body 20.

The first mechanism 40 includes a side 401 that extends away from the stationary track 30 along the first second direction D2. The system 60 includes an actuator screw 601 that is disposed to extend through and threadably engage with the side 401 of the first mechanism 40 and end guides 602. The end guides 602 are threadably engageable with the actuator screw 601 and are disposed on opposite ends of the second mechanism 50. In accordance with an embodiment, as shown in FIG. 3, the second mechanism 50 includes flanges 501 at the opposite ends of the second mechanism 50 and the end guides 602 include complementary flanges 610. The complementary flanges 610 are configured to securely register with the flanges 501 at the opposite ends of the second mechanism 50.

With this construction, as the actuating screw 601 is rotated about its longitudinal axis, the end guides 602 clamp onto the second mechanism 50 and, with the actuating screw 601 being threadably engageable with the side 401 of the first mechanism 40, the external force is applied to the first mechanism 40. That is, the rotation of the actuating screw 601 draws the side 401 of the first mechanism 40 toward the end guides 602. The first mechanism 40 thus moves in the first direction D1 relative to the first body 20 and the second mechanism 50. This movement of the first mechanism 40 in the first direction D1, in turn, induces movement of the second mechanism 50 in the second direction D2 due to the cam configuration of the slip fitting 90.

The first and second guide slots 400 and 500 extend along the first and second directions D1 and D2, respectively. Also, the second guide slot 500 may be plural in number and the plurality of the retainer buttons 80 may include multiple retainer buttons 80 that are configured to be respectively engageable with the plural second guide slots 500. In accordance with embodiments, the first mechanism 40 includes a first flange 402, which is formed to define the first guide slot 400, and which is relatively thin as compared to a thickness of the first mechanism 40 as a whole. Similarly, the second mechanism 50 includes a second flange 502 (for each second guide slot 500), which is formed to define the second guide slot 500, and which is relatively thin as compared to a thickness of the second mechanism 50 as a whole.

The one of the plurality of retainer buttons 80, which is engageable with the first guide slot 400, includes a neck 81 that is configured to extend through the first guide slot 400 and a head 82 that is configured to abut with the first flange 402 along the third direction D3. With this construction, since the first guide slot 400 extends along the first direction D1, as the first mechanism 40 moves in the first direction D1, the neck 81 permits the retainer button 80 to move along the first guide slot 400 and the head 82 prevents movement of the first mechanism 40 away from the first body 20 in the third direction D3.

The one of the plurality of retainer buttons 80, which is engageable with the second guide slot(s) 500, includes a neck 81 that is configured to extend through the second guide slot 500 and a head 82 that is configured to abut with the second flange 502 along the third direction D3. With this construction, since the second guide slot 500 extends along the second direction D2, as the second mechanism 50 moves in the second direction D2, the neck 81 permits the retainer button 80 to move along the second guide slot 500 and the head 82 prevents movement of the second mechanism 50 away from the first body 20 in the third direction D3.

Since the flanges 402 and 502 of the first and second mechanisms 40 and 50, respectively, are relatively thin as compared to the respective thicknesses of the first and second mechanisms 40 and 50, the heads 82 of the retainer buttons 80 need not protrude beyond planes of the first or second mechanisms 40 or 50 in the third direction D3. In particular, a thickness of the heads 82 may be provided such that the heads 82 are coplanar with or recessed from the planes of the first or second mechanisms 40 or 50. In this way, the first and second mechanisms 40 and 50 can be secured proximate to the plane of the first body 20 without increasing a thickness of the slim line mechanism 10 as a whole.

In accordance with further aspects of the invention, it is to be understood that the components described above may be provided in combination with one another or, in some cases, alone. For example, the slim line mechanism 10 may include the interlock of the first and second mechanisms 40 and 50 with or without the retainer buttons 80, the retainer buttons 80 with or without the interlock of the first and second mechanisms 40 and 50 and/or the interlock of the first and second mechanisms 40 and 50 and the retainer buttons 80.

Figure 4:
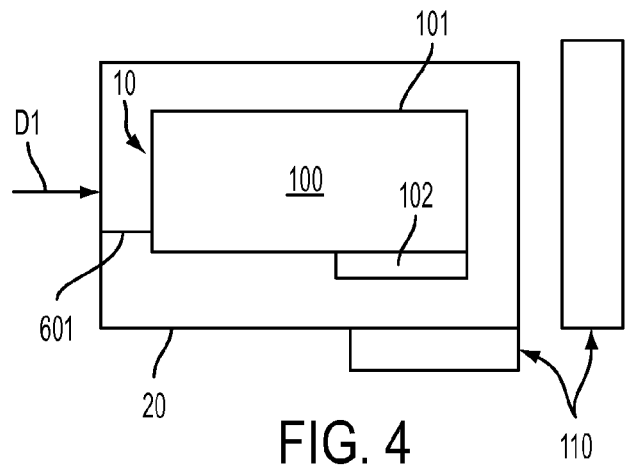
FIG. 4 illustrates an initial operation in a process of connecting a card in a docking station using the slim line mechanism of FIGS. 1-3.
Figure 5:
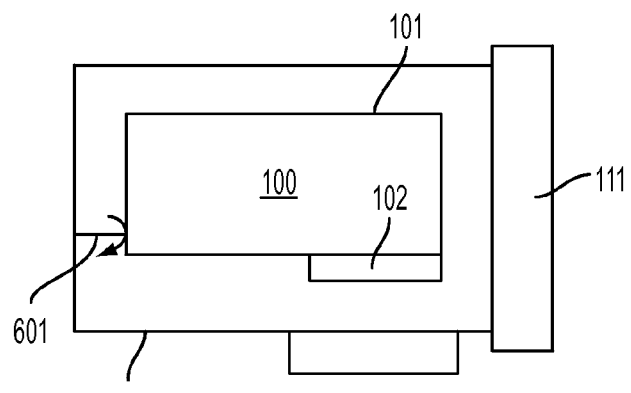
FIG. 5 illustrates an intermediate operation in a process of connecting a card in a docking station using the slim line mechanism of FIGS. 1-3.
Figure 6:
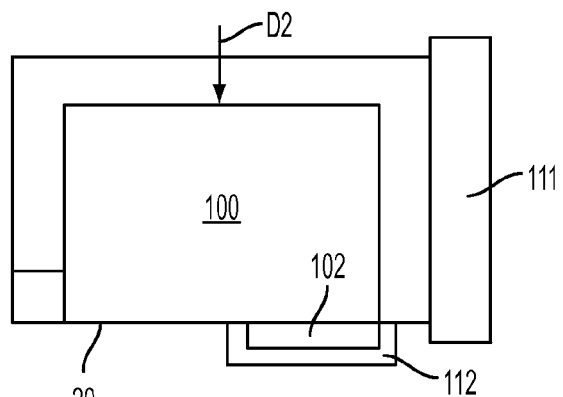
FIG. 6 illustrates an ending operation in a process of connecting a card in a docking station using the slim line mechanism of FIGS. 1-3.

In accordance with still further aspects of the invention, with reference to FIGS. 4-6, the slim line mechanism 10 as described above can be employed in a blind mating process between a card 100, such as a memory or processor card formed of a PCB 101 and a connector 102, and a docking station 110 of a computing device. Such a process begins with the PCB 101 being placed in the first body 20 and connected with the second mechanism 50 at connection sites 103 (see FIG. 1), as shown in FIG. 4. The first body 20 is then installed within a slot 111 of the docking station 110 in for example the first direction D1. At this point, the actuation screw 601 is rotated in a tightening (i.e. clockwise) direction to drive the first mechanism 40 in the first direction D1 relative to the first body 20 and such that the first mechanism 40 drives the second mechanism 50, as shown in FIG. 5. This movement of the first mechanism 40 induces movement of the second mechanism 50 as described above in the second direction D2 such that at least the connector 102 is placed into an appropriate position for connection with the connector 112 of the docking station 110, a shown in FIG. 6.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A slim line mechanism, comprising:
a first body having a stationary track coupled thereto;
a first mechanism, which is supportable between the stationary track and the first body and configured to be driven in a first direction;
a second mechanism, which is configured to be driven by the first mechanism in a second direction transverse with respect to the first direction;
a system by which the first and second mechanisms are coupled to one another, the system comprising an actuator disposable through the first mechanism and guides threadably engageable with the actuator to register with the second mechanism; and
connectors by which the first body is supportively connectable with the first and second mechanisms such that movements thereof in the first and second directions, respectively, are permitted.

2. The slim line mechanism according to claim 1, wherein the second mechanism is configured to be interlocked with the first mechanism.

3. The slim line mechanism according to claim 2, further comprising a slip fitting by which the first and second mechanisms are configured to be interlocked.

4. The slim line mechanism according to claim 1, wherein:
the actuator of the system comprises an actuator screw disposed to extend through a side of the first mechanism; and
the guides of the system comprise end guides, which are threadably engageable with the actuator screw to securely register with opposite ends of the second mechanism.

5. The slim line mechanism according to claim 1, wherein the first body comprises a chassis, which is configured to be installed in a slot of a computing device.

6. The slim line mechanism according to claim 1, wherein the second mechanism is connectable with a printed circuit board (PCB).

7. A slim line mechanism, comprising:
a first body having a stationary track coupled thereto;
a first mechanism formed to define a first guide slot, which is supportable between the stationary track and the first body and configured to be driven in a first direction;
a second mechanism formed to define a second guide slot, which is configured to be driven by the first mechanism in a second direction;
a system by which the first and second mechanisms are coupled to one another, the system comprising an actuator disposable through the first mechanism and guides threadably engageable with the actuator to register with the second mechanism; and
a plurality of buttons supportively connectable with the first body and engageable with the first and second guide slots to respectively secure the first and second mechanisms to the first body along a third direction,
the first, second and third directions being transverse with respect to one another.

8. The slim line mechanism according to claim 7, wherein the second mechanism is configured to be interlocked with the first mechanism.

9. The slim line mechanism according to claim 8, further comprising a slip fitting by which the first and second mechanisms are configured to be interlocked.

10. The slim line mechanism according to claim 7, wherein:
the actuator of the system comprises an actuator screw disposed to extend through a side of the first mechanism; and
the guides of the system comprise end guides, which are threadably engageable with the actuator screw to securely register with opposite ends of the second mechanism.

11. The slim line mechanism according to claim 7, wherein the first and second guide slots extend along the first and second directions, respectively.

12. The slim line mechanism according to claim 7, wherein the second guide slot is plural in number and the plurality of buttons comprises multiple buttons respectively engageable with the plural second guide slots.

13. The slim line mechanism according to claim 7, wherein the first mechanism comprises a first flange defining the first guide slot.

14. The slim line mechanism according to claim 13, wherein the one of the plurality of buttons engageable with the first guide slot comprises:
- a neck configured to extend through the first guide slot; and
- a head configured to abut with the first flange along the third direction.

15. The slim line mechanism according to claim 5, wherein the second mechanism comprises a second flange defining the second guide slot.

16. The slim line mechanism according to claim 13, wherein the one of the plurality of buttons engageable with the second guide slot comprises:
- a neck configured to extend through the second guide slot; and
- a head configured to abut with the second flange along the third direction.

17. A slim line mechanism, comprising:
- a first body having a stationary track coupled thereto;
- a first mechanism, which is supportable between the stationary track and the first body and configured to be driven in a first direction;
- a second mechanism, which is configured to be interlocked with the first mechanism and thereby configured to be driven by the first mechanism in a second direction transverse with respect to the first direction; and
- a system by which the first and second mechanisms are coupled to one another, the system comprising an actuator disposable through the first mechanism and guides threadably engageable with the actuator to register with the second mechanism.

18. The slim line mechanism according to claim 17, further comprising:
- connectors by which the first body is supportively connectable with the first and second mechanisms such that movements thereof in the first and second directions, respectively, are permitted.

19. The slim line mechanism according to claim 17, further comprising a slip fitting by which the first and second mechanisms are configured to be interlocked.

20. The slim line mechanism according to claim 17, wherein:
- the actuator of the system comprises an actuator screw disposed to extend through a side of the first mechanism; and
- the guides of the system comprise end guides, which are threadably engageable with the actuator screw to securely register with opposite ends of the second mechanism.

* * * * *